United States Patent [19]

Okuda et al.

[11] Patent Number: 5,568,505
[45] Date of Patent: Oct. 22, 1996

[54] LASER DIODE ELEMENT WITH EXCELLENT INTERMODULATION DISTORTION CHARACTERISTIC

[75] Inventors: Tetsuro Okuda; Hirohito Yamada; Toshitaka Torikai, all of Tokyo, Japan

[73] Assignee: NEC Corporation, Tokyo, Japan

[21] Appl. No.: 463,635

[22] Filed: Jun. 6, 1995

Related U.S. Application Data

[62] Division of Ser. No. 178,859, Jan. 7, 1994, Pat. No. 5,469,459.

[30] Foreign Application Priority Data

Jan. 8, 1993 [JP] Japan .......................................... 5-1501
Apr. 21, 1993 [JP] Japan ........................................ 5-93460

[51] Int. Cl.$^6$ ....................................................... H01S 3/08
[52] U.S. Cl. ............................................. 372/96; 372/102
[58] Field of Search ................................... 372/96, 97, 102

[56] References Cited

U.S. PATENT DOCUMENTS

| | | | |
|---|---|---|---|
| 4,775,980 | 10/1988 | Chinone et al. | 372/102 |
| 4,794,618 | 12/1988 | Mito | 372/102 |
| 4,796,273 | 1/1989 | Yamaguchi | 372/102 |
| 4,805,178 | 2/1989 | Wilt | 372/102 |
| 4,852,116 | 7/1989 | Takiguchi et al. | 372/102 |
| 5,012,484 | 5/1991 | Flynn et al. | |
| 5,020,072 | 5/1991 | Abe et al. | 372/102 |
| 5,105,433 | 4/1992 | Eisele et al. | 372/97 |
| 5,119,393 | 6/1992 | Oka et al. | 372/102 |
| 5,155,737 | 10/1992 | Ikeda et al. | 372/102 |
| 5,170,402 | 12/1992 | Ogita et al. | |
| 5,177,758 | 1/1993 | Oka et al. | 372/102 |
| 5,212,712 | 5/1993 | Makuta | 372/102 |
| 5,220,573 | 6/1993 | Sakata et al. | 372/102 |

FOREIGN PATENT DOCUMENTS

| | | |
|---|---|---|
| 62-219684 | 9/1987 | Japan . |
| 1155677 | 6/1989 | Japan . |
| 220087 | 1/1990 | Japan . |
| 290688 | 3/1990 | Japan . |
| 3283483 | 12/1991 | Japan . |

OTHER PUBLICATIONS

IEEE Journal on Selected Areas in Communications, vol. 8, No. 7, Sep. 1990, pp. 1359–1364, A. Takemoto et al., "Distributed Feedback Laser Diode and Module for CATV Systems".

Patent Abstracts of Japan, vol. 16, No. 108, 17 Mar. 1992.

Electronics Letters, vol. 22, No. 20, 25 Sep. 1986, pp. 1047–1049, H. Soda et al., "Design of DFB Lasers for High-power Single–Mode Operation".

IEE Proceedings, Part J, voil. 133, No. 2, Apr. 1986, pp. 163–164, J. Buus, "Dynamic Single–Mode Operation on DFB Lasers with Phase Shifted Gratings and Reflection Mirrors".

Journal of Lightwave Technology, vol. 5, No. 6, Jun. 1987, pp. 848–855, H. Ishikawa et al., "Distributed Feedback Laser Emitting at 1.3 μm for Gigabit Communication Systems".

IEEE Journal of Quantum Electronics, vol. 27, No. 8, Aug. 1991, ppl. 1990–2002, G. Morthier et al, "Theoretical Investigation of tyhe Second–Order Harmonic Distortion in the AM–Response of 1.55 μm F–P and DFB Lasers".

Primary Examiner—Rodney B. Bovernick
Assistant Examiner—Robert E. Wise
Attorney, Agent, or Firm—Sughrue, Mion, Zinn, Macpeak & Seas

[57] ABSTRACT

In a laser diode element including a front facet, a rear facet, a laser cavity formed between the front the rear facets and which has a predetermined length L, coating layers coated on the front facet to provide a reflectivity smaller than 5%, and an active layer and a uniform grating having regular corrugation formed in the direction of the laser cavity and which are coupled to each other at a predetermined coupling constant K, the laser diode element is specified by a product of the predetermined coupling constant and the predetermined length L and falling within a range between 0.4 and 1.0, both inclusive.

4 Claims, 14 Drawing Sheets

REFLECTIVITY ON A REAR SURFACE 75%

$\kappa L = 0.7$

REFLECTIVITY ON A FRONT SURFACE 1%

$\kappa L = 0.7$ (a)

(b)

(c)

(d)

LASER DIODE ELEMENT WITH EXCELLENT INTERMODULATION DISTORTION CHARACTERISTIC

This is a divisional of application Ser. No. 08/178,859 filed Jan. 7, 1994, now U.S. Pat. No. 5,469,459.

BACKGROUND OF THE INVENTION

This invention relates to a laser diode element and, particularly, to a Distributed Feed Back (DFB) laser diode element.

A conventional laser diode element of the type described generally comprises a semiconductor block which has a front facet, a rear facet opposite to the front facet, a laser cavity formed between the front and the rear facets and having a predetermined length L, a plurality of coating layers coated on the front and the rear facets to provide a predetermined reflectivity, respectively, an active layer and a grating formed in the direction of the laser cavity and coupled to each other at a predetermined coupling constant K.

Many types of the DFB laser diode elements nave been developed to have good single longitudinal mode characteristics.

For example, some DFB laser diode elements have been proposed in Japanese patent application laid-open No. H1-155677, H2-90688, and H2-20087. In these examples, the predetermined reflectivity as well as a product of the predetermined coupling constant K and the predetermined length L in each DFB laser diode element are optimized from each point of view.

On the other hand, an another DFB laser diode element has been proposed in Japanese patent application laid-open No Sho 62-219684. As illustrated in the drawing of the laid-open paper, She DFB laser diode element includes a partial grating having a regular corrugation kept in contact with the front facet.

In the interim, a DFB laser diode element has recently been used as a light source for an analog modulation in a subcarrier multiplexing optical transmission method, or the like.

When used as such a light source for the analog modulation, the DFB laser diode element is required to have a better intermodulation distortion characteristic. For example, in the field of a mobile communication system, the DFB laser diode element is desired to have a characteristic in which 3rd intermodulation distortion ($IMD_3$) is sufficiently small.

However, any of the conventional laser diode elements mentioned above have never been fabricated on the purpose of the analog modulation. Accordingly, no consideration has been made about intermodulation distortion characteristics in the conventional laser diode elements. As a result, even when the conventional laser diode elements are used as light sources for the analog modulations, a yield in getting laser diode elements with sufficient intermodulation distortion characteristics is inevitably not so good.

SUMMARY OF THE INVENTION

It is therefore an object of this invention to provide a laser diode element which has an excellent intermodulation distortion characteristic and a method of manufacturing the same.

It is another object of this invention to provide a laser diode element of the type described which can be manufactured in a good yield and a method of manufacturing such a laser diode element.

According to an aspect of this invention, there is provided a laser diode element comprising: a semiconductor block having: a first end surface; a second end surface opposite to the first end surface; a laser cavity which is formed between the first and the second end surfaces and which has a predetermined length L; a plurality of coating layers which are coated on the first end surface to provide a reflectivity smaller than 5%; and an active layer and a uniform grating which are formed in the direction of the laser cavity and which are coupled to each other at a predetermined coupling constant K; the laser diode element being specified by a product of the predetermined coupling constant K and the predetermined length L and falling within a range between 0.4 and 1.0, both inclusive.

The product of the predetermined coupling constant K and the predetermined length L may preferably fall within a range between 0.5 and 0.7, both inclusive.

The reflectivity may be not greater than 1%.

The laser diode element may further comprise a plurality of additional coating layers which are coated on the second end surface to provide a reflectivity not smaller than 50%.

The reflectivity provided by the additional coating layers may be preferably not smaller than 90%.

According to another aspect of this invention, there is provided a laser diode element comprising: a semiconductor block having: a first end surface; a second end surface opposite to the first end surface; a laser cavity which is formed between the first and the second end surfaces and which has a predetermined length L; an active layer and a partial grating which are formed in the direction of the laser cavity and which are coupled to each other at a predetermined coupling constant K; the partial grating being nearer to one of the first and the second end surfaces than to the other of the first and the second end surfaces and being remote from the one of the first and the second end surfaces to divide the direction of the laser cavity into a short length side and a long length side with the partial grating interposed therebetween.

According to still another aspect of this invention, there is provided a method of manufacturing a laser diode element comprising the steps of: uniformly coating a photoresist layer onto a semiconductor substrate; partially forming a grating pattern on the photoresist layer by holographic lithography method; selectively emitting light onto an area in which a grating is not formed to make the area exposed; etching the semiconductor substrate with the grating pattern operable as an etching mask to form the grating; forming a guiding layer to make the grating buried therein; growing an active layer on the guiding layer; and forming a clad layer on the active layer.

DESCRIPTION OF THE PREFERRED EMBODIMENT

Prior to description of several embodiments, principle of the present invention will first be described for a better understanding of the present invention.

During the process of creating the present invention, the inventors of the present invention have experimentally fabricated plenty of DFB laser diode elements each of which has a uniform grating to investigate characteristics thereof by changing some parameters in each DFB laser diode element.

Figure 1:
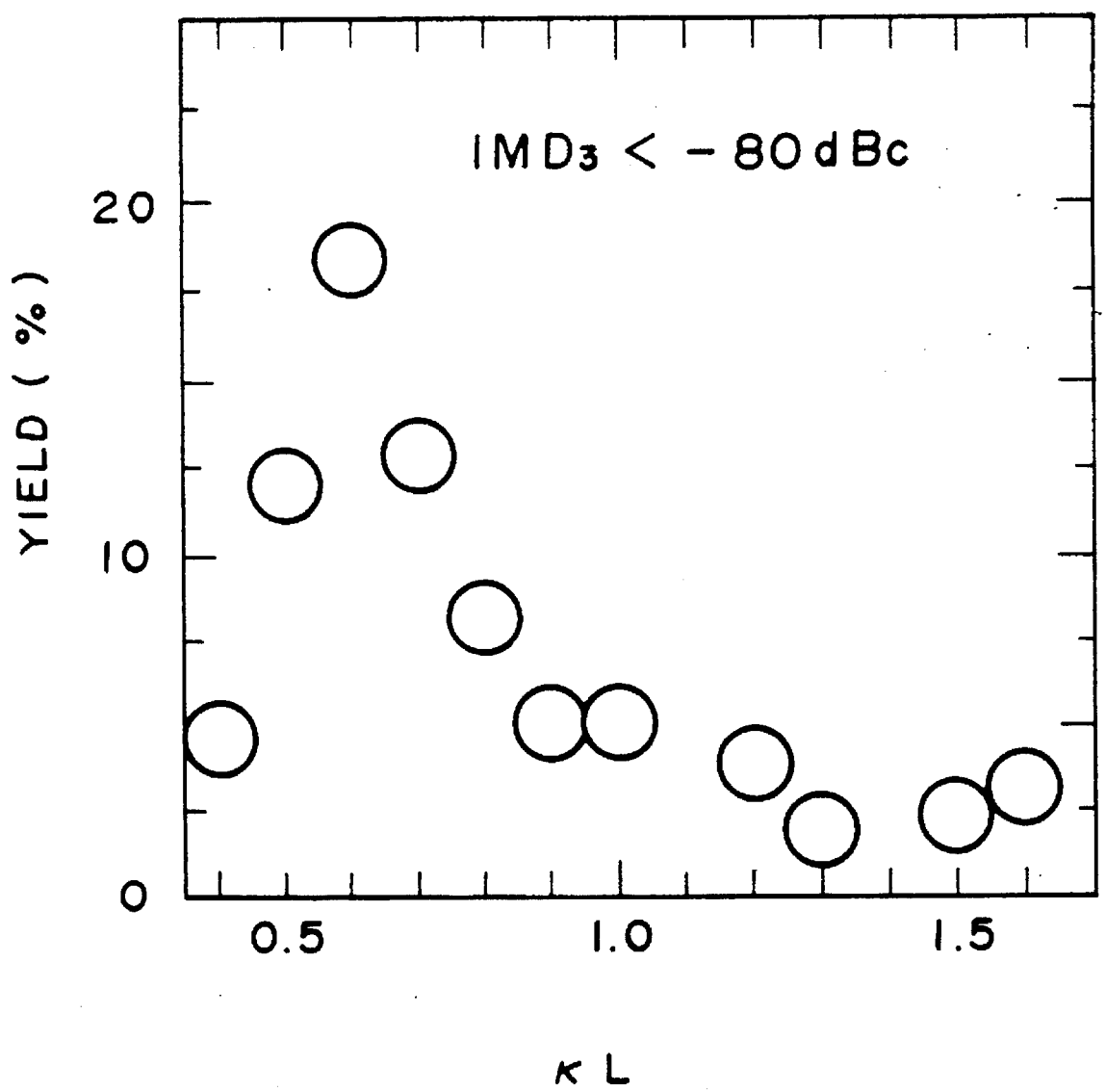
FIG. 1 shows a graphical representation for use in describing a relationship between yield and KL in several examples according to the present invention.

Referring to FIGS. 1 to 3, description is made about results of the inventors' experimental studies.

In FIG. 1, shown is a result of accounting a yield with respect to a product of a coupling constant K and a length L of the laser cavity in the DFB laser diode elements each of which has a uniform grating. In each DFB laser diode element, a reflectivity on a front surface is adjusted to be 1% while a reflectivity on a rear surface is adjusted to be 75%. Herein, the yield is defined to be a rate of numbers of the DFB laser diode elements in which a value of the above-mentioned $IMD_3$ is not larger than −80 dBc on conditions that normalized resonator lose is not smaller than 0.05, an average light output power is 8 mW, and optical modulation index is 20%. The value of the $IMD_3$ in each DFB laser diode element is accounted by the use of linearity of I-L characteristics of the DFB laser diode element. The linearity of I-L characteristics is determined by considering an electrical field distribution along the laser cavity in each DFB laser diode element.

As exemplified in FIG. 1, the yield can be improved to exceed 5% when the laser diode elements are specified by the product KL of the coupling constant K and the length L of the laser cavity which falls within a range between 0.4 and 1.0, both inclusive. The yield can further be improved to exceed 10% when the product KL falls within a range between 0.5 and 0.7, both inclusive.

Figure 2A:
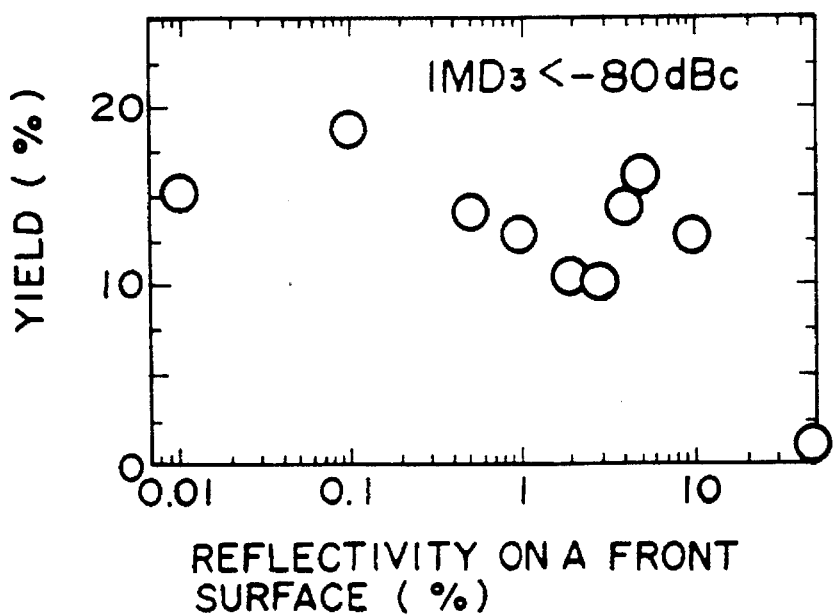
FIG. 2(a) shows a graphical representation for use in describing a relationship between yield and reflectivity on a front surface in several examples according to the present invention.

In Figs 2(a) and (b), shown is a result of accounting a yield with respect to reflectivities on front and rear surfaces in the DFB laser diode elements similar to those mentioned in respect of FIG. 1. Lake in FIG. 1, the yield is defined to be a rate of numbers of the DFB laser diode elements in which a value of the above-mentioned $IMD_3$ is not larger than −80 dBc on conditions similar to those mentioned in respect of Fig 1.

In FIG. 2(a), shown is a result of accounting a yield with respect to a reflectivity on a front surface in the DFB laser diode elements. In each DFB laser diode element, the product KL is arranged to 0.7 and a reflectivity on a rear surface is adjusted to be 75%.

As exemplified in FIG. 2(a), the yield can be improved to be at least not smaller than 10% when the reflectivity on the front surface in each laser diode element is made to be smaller than 5%. The yield can further be improved to be at least not smaller than 12% when the reflectivity on the front surface is made to be not greater than 1%.

Figure 2B:
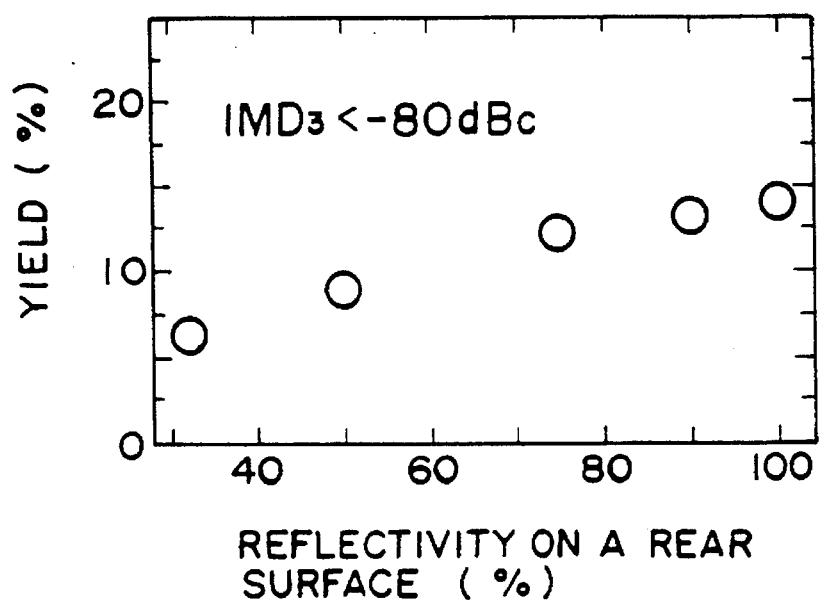
FIG. 2(b) shows a graphical representation for use in describing a relationship between yield and reflectivity on a rear surface in several examples according to the present invention.

On the other hand, a result of accounting a yield with respect to a reflectivity on a rear surface in the DFB laser diode elements is shown in FIG. 2(b). In each DFB laser diode element, the product KL is arranged to be 0.7 and a reflectivity on a front surface is adjusted to be 1%.

As exemplified in FIG. 2(b), the yield can be improved to exceed 10% when the reflectivity on the rear surface in each laser diode element is made to be approximately not smaller than 50%.

Figure 3A:
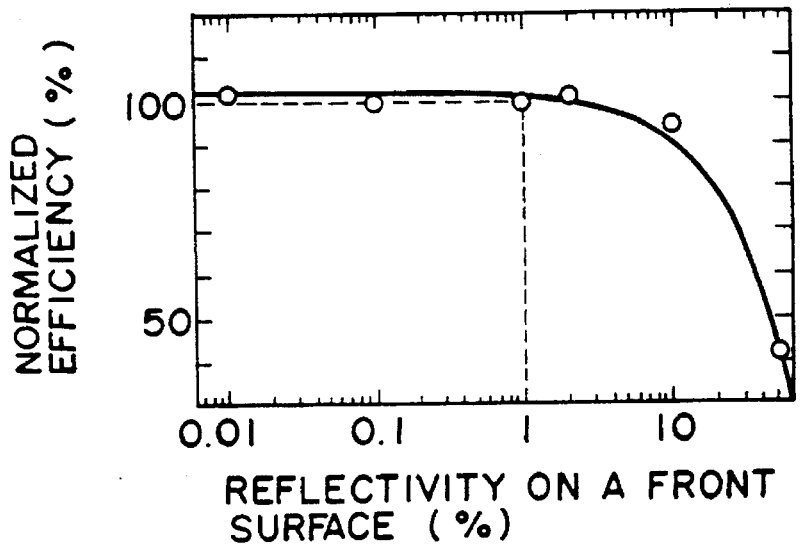
FIG. 3(a) shows a graphical representation for use in describing a relationship between normalized efficiency and reflectivity on a front surface in several examples according to the present invention.

In FIGS. 3(a) and (b), shown is a result of accounting a normalized efficiency with respect to reflectivities on front and rear surfaces in the experimentally fabricated DFB laser diode elements each in which the product KL is arranged to be 0.7.

In FIG. 3(a), shown is a result of accounting a normalized efficiency with respect to a reflectivity on the front surface. As indicated by broken lines in FIG. 3(a), an average efficiency in the DFB laser diode elements is normalized by the average efficiency when the reflectivity on the front surface is adjusted to be 1%.

As exemplified in FIG. 3(a), the normalized efficiency is stable when the reflectivity on the front surface is not greater than 1%. It is also exemplified in FIG. 3(a) that the normalized efficiency is gradually deteriorated when the reflectivity on the front surface exceeds 1%.

Figure 3B:
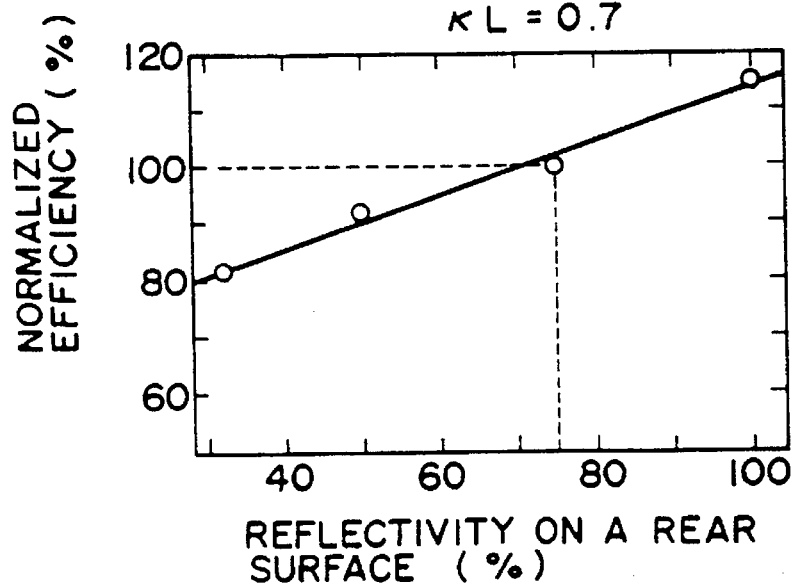
FIG. 3(b) shows a graphical representation for use in describing a relationship between normalized efficiency and reflectivity on a rear surface in several examples according to the present invention.

On the other hand, a result of accounting a normalized efficiency with respect to a reflectivity on the rear surface is shown in FIG. 3(b). As indicated by broken lines in FIG. 3(b), an average efficiency in the DFB laser diode elements is normalized by the average efficiency when the reflectivity on the rear surface is adjusted to be 75%.

As exemplified in FIG. 3(b), the normalized efficiency is raised linearly as the reflectivity on the rear surface becomes great. It is therefore concluded in FIG. 3(b) that the normalized efficiency is further improved when the reflectivity on the rear surface is made to be not smaller than 90% and that the normalized efficiency is maximized when the reflectivity on the rear surface is made to be 100%. Besides, the reflectivity on the rear surface should not exceed 98% when light output through the rear surface is desired to be monitored.

Figure 4:
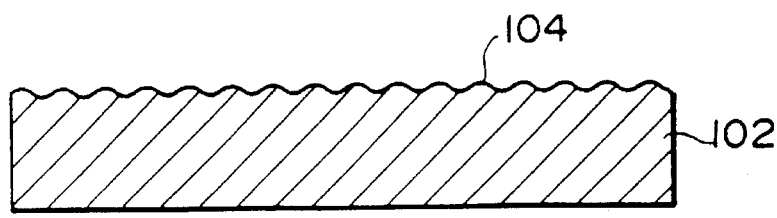
FIGS. 4(a) through (d) show in schematic vertical sections a laser diode element during progress of a method of manufacturing the laser diode element according to the first embodiment of the present invention.
Figure 4:
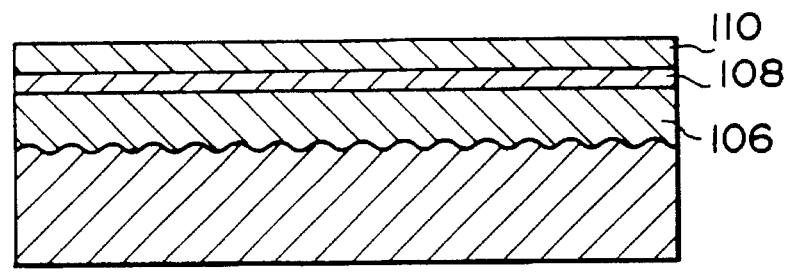
Figure 4:
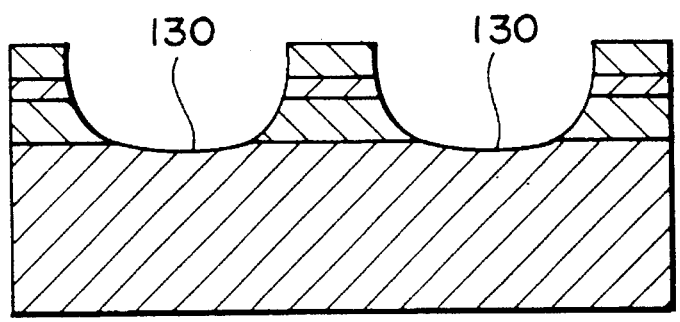
Figure 4:
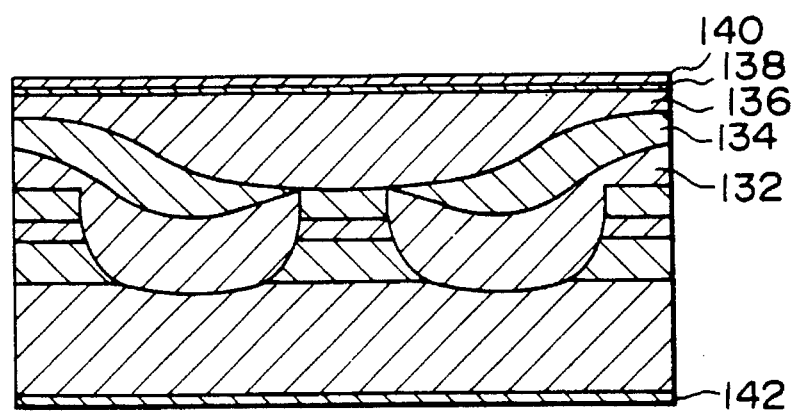
Figure 5:
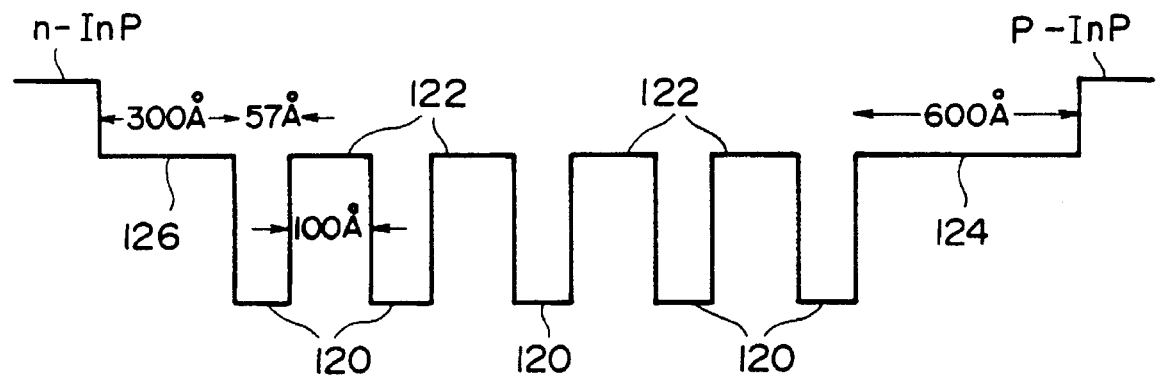
FIG. 5 shows a band diagram of active layers of the laser diode element according to the first embodiment of the present invention.

Referring now to FIGS. 4 and 5, description will proceed to a method of manufacturing a laser diode element according to a first embodiment of this invention.

As illustrated in FIG. 4(a), a substrate 102 is at first prepared in a known manner. The substrate 102 is made of InP and has a conductivity type n.

Next, a uniform grating 104 having a regular corrugation is formed on the substrate 102 by holographic lithography method to have a period of 2025 angstroms and a depth of 250 angstroms.

Third, as illustrated in FIG. 4(b), a light guiding layer 106 of InGaAsP having a conductivity type n is grown on the uniform grating 104 by Metal Organic Vapor Phase Epitaxy (MOVPE) method to have a thickness 1000 angstroms. Active layers of Multi Quantum Well (MQW) 108 are then grown on the light guiding layer 106 by the MOVPE method to have a thickness of approximately 0.5 micron meters. Thereafter, a clad layer of InP having a conductivity type p 110 is grown on the active layers 108 by the MOVPE method to have a thickness of approximately 0.5 micron meters.

Referring to FIG. 5, the active layers of MQW include wells 120 and barriers 122. The wells 120 have a composition defined by a bandgap corresponding to a wavelength of 1.40 micron meters. On the other hand, the barriers 122 have a composition defined by a bandgap corresponding to a wavelength of 1.13 micron meters. Specifically, the wells 120 are equal in number to five. Each well is provided by a film having a thickness of 57 angstroms while each barrier is also provided by a film having a thickness of 100 angstroms. The wells 120 and the barriers 122 are interposed on both sides between SCH layers 124 and 126 each of which has a composition defined by a bandgap corresponding to a wavelength of 1.13 micron meters. As illustrated in FIG. 5, the SCH layer 124 is adjacent to a p-InP layer and has a thickness of 600 angstroms while the SCH layer 126 is adjacent to a n-INP layer and has a thickness of 300 angstroms.

After growth of the active layers of MQW 108, a positive photoresist (not shown) is coated on the MQW active layers 108. Photolithography and etching are then carried out in a known manner to form stripe-shaped grooves 130, as illustrated in FIG. 4(c).

Thereafter, p-InP electric current blocking layer 132, n-InP electric current blocking layer 134, p-InP clad layer 136, and p-InGaAsP cap layer 138 are formed one by one by Liquid Phase Epitaxy (LPE) to form a double-channel planar buried hereto (DC-PBH) structure.

Further, electrode layers 140 and 142 are evaporated on both surfaces of the DC-PBH structure. The DC-PBH structure is cleaved at a predetermined portion. The coating layers (not shown) are coated on a rear facet (not shown) to provide a reflectivity of 75% while the additional coating layers (not shown) are coated on a front facet to provide a reflectivity of 1%. Each layer is composed of SiN. Thereafter, the cleaved DC-PBH wafer is scribed or cut along the width direction into a plurality of the laser diode elements.

Under the circumstances, characteristics of each of the laser diode elements have been investigated and estimated. Consequently, it has been found out that the laser diode element oscillates with a wavelength of 1.31 micron meters and that the efficiency is about 0.4 W/A. It has also been found out that a value of KL is about 0.9.

In order to estimate intermodulation distortion characteristics of the laser diode element, the laser diode element is assembled into a module so that $IMD_3$ of the laser diode element be measured. As a result, a value of the above-mentioned $IMD_3$ was smaller than −85 dBc on conditions that an average light output power is 4 mW and optical modulation index is 20%.

Thus, it has been confirmed that the laser diode element has excellent intermodulation distortion characteristics.

In this event, a yield, which is defined to be a rate of numbers of the laser diode elements in which a value of the above-mentioned $IMD_3$ is smaller than −85 dBc, was about 4% among all of the laser diode elements.

In order to make the yield improved, the inventors have also fabricated another laser diode elements each of which has a uniform grating having a regular corrugation of a depth of 200 angstroms. Characteristics of each of the another laser diode elements have also been investigated and estimated. Consequently, it has been found out that a value of KL is about 0.7 and that the yield, which is defined similarly to the above-mentioned manner, was about 12% among all of the another laser diode elements.

Further, the inventors have fabricated still another laser diode elements each of which has coating layers on its front facet having a reflectivity of 0.1%. In this event, the yield was further improved to be about 16%.

Furthermore, the inventors have fabricated yet another laser diode elements each of which has coating layers on its rear facet having a reflectivity of 90%. In this event, the efficiency was improved to be about 0.43 W/A.

Thus, the laser diode elements having excellent intermodulation distortion characteristics can be manufactured in a good yield.

Figure 6:
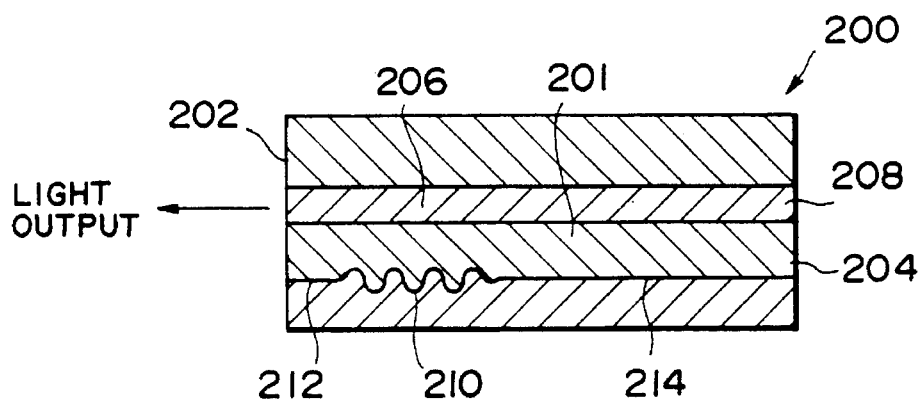
FIG. 6 schematically shows in vertical section a side view of a laser diode element according to the second embodiment of the present invention.

Referring to FIG. 6, description is made about a laser diode element according to the second embodiment of the present invention.

As illustrated in FIG. 6, the laser diode element 200 comprises a semiconductor block 201 having a front facet 202, a rear facet 204 opposite to the front facet 202, a laser cavity 206 which is formed between the front and the rear facets 202 and 204 and which has a predetermined length L, an active layer 208 and a partial grating 210 having regular corrugation which are formed in the direction of the laser cavity 206 and which are coupled to each other at a predetermined coupling constant K. The partial grating 210 is nearer to the front facet 202 than to the rear facet 204 and is remote from the front facet 202 to divide the direction of the laser cavity into a short length side 212 and a long length side 214 with the partial grating 210 interposed between the short and the long length sides 212 and 214.

In this embodiment, the partial grating 210 is remote from the front facet 202 and the rear facet 204 both of which are operable as cleaved surface. Accordingly, laser diode elements, each of which is cleaved and scribed from a wafer, become stable in their characteristics. The laser diode elements having sufficient characteristics can be manufactured in a good yield.

Besides, the front facet and the rear facet may be called a first end surface and a second end surface, respectively.

Figure 7:
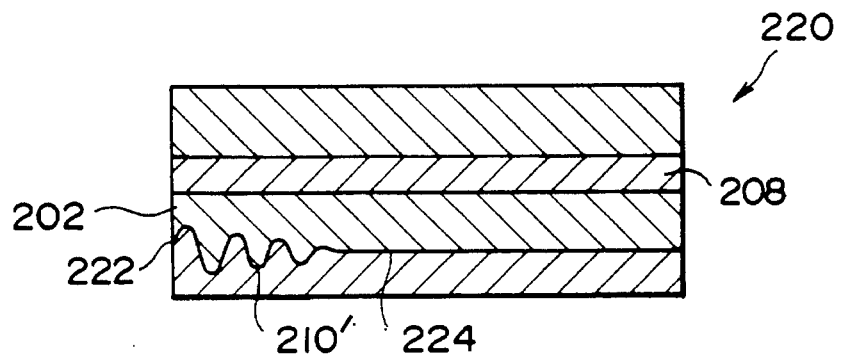
FIG. 7 schematically shows in vertical section a side view of a laser diode element according to the third embodiment of the present invention.

Referring to FIG. 7, a laser diode element 220 according to the third embodiment of this invention has a structure similar to that of the laser diode element 200 illustrated in FIG. 6 except for the followings.

In this embodiment, the partial grating 210' is kept in contact with the front facet 202 to provide a contact side 222 and a non-contact side 224 with the partial grating 210' interposed therebetween and extended from the contact side 222 towards the non-contact side 224. The coupling constant K is larger in the contact side 222 than in the non-contact side 224. Namely, the coupling constant K becomes small as a distance in the direction becomes remote from the contact side 222.

Figure 8:
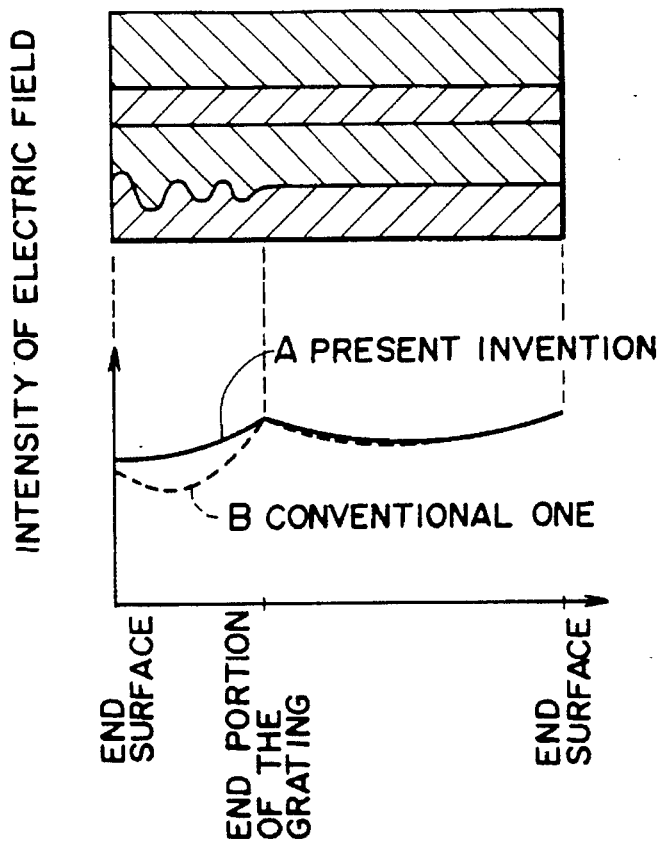
FIG. 8 shows an electrical field distribution in the direction of a laser cavity in the laser diode element illustrated in FIG. 7 in comparison with the conventional one.

Referring to FIG. 8, description is made about an electrical field distribution in the direction of a laser cavity in the laser diode element 220 illustrated in FIG. 7 in comparison with the conventional one.

As depicted by a continuous line A in FIG. 8, the electrical field distribution in the laser diode element 220 becomes even or uniform in the direction of the laser cavity compared with the conventional one of which the distribution is depicted by a broken line B. A linearity of I-L characteristics is therefore improved in this embodiment. As a result, intermodulation distortion is considerably decreased in this embodiment.

Figure 9:
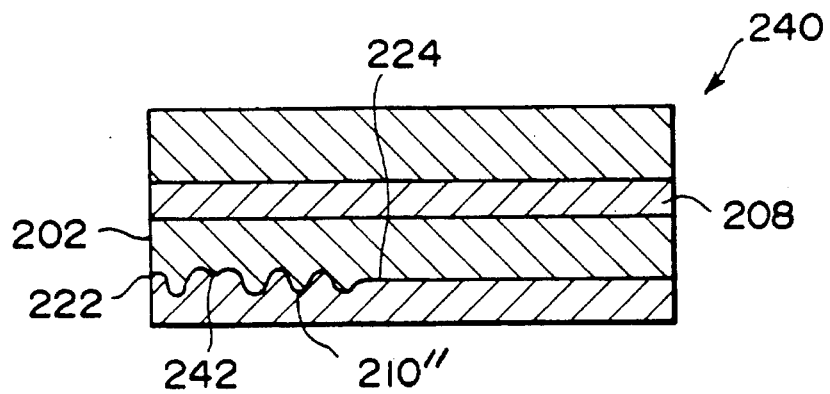
FIG. 9 schematically shows in vertical section a side view of a laser diode element according to the fourth embodiment of the present invention.

Referring to FIG. 9, a laser diode element 240 according to the fourth embodiment of this invention has a structure similar to that of the laser diode element 200 illustrated in FIG. 6 except for the followings.

In this embodiment, the partial grating 210 " is kept in contact with the front facet 202 to provide a contact side 222 and a non-contact side 224 with the partial grating 210 " interposed therebetween and extended from the contact side 222 towards the non-contact side 224. The regular corrugation of the grating has an irregular portion 242 which is operable as a phase shift portion.

Figure 10:
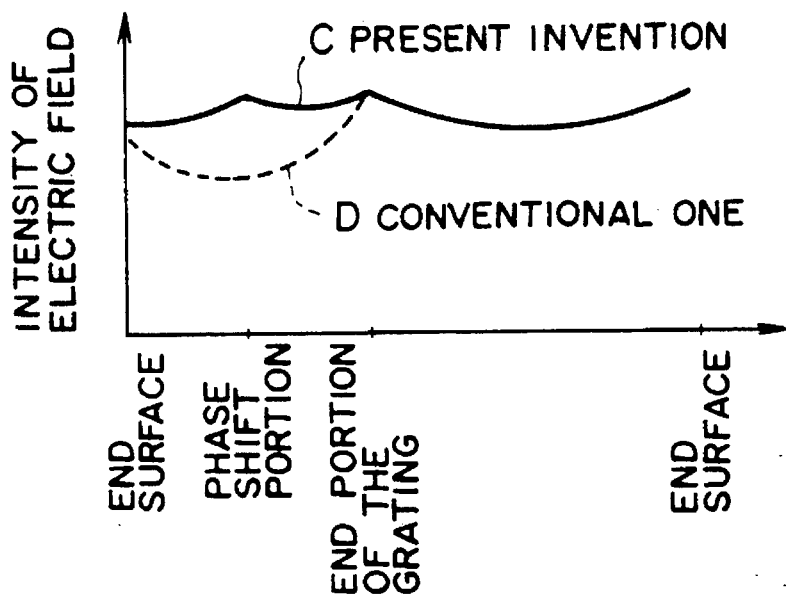
FIG. 10 shows an electrical field distribution in the direction of a laser cavity in the laser diode element illustrated in FIG. 9 in comparison with the conventional one.

Referring to FIG. 10, description is made about an electrical field distribution in the direction of a laser cavity in the laser diode element 240 illustrated in FIG. 9 in comparison with the conventional one.

In FIG. 10, a continuous line c shows an electrical field distribution in the laser diode element 240 while a broken line D shows that of the conventional laser diode element As shown in FIG. 10, the continuous line C has a peak in the portion corresponding to the above-mentioned irregular or phase shift portion 242. As a result, the electrical field distribution in the laser diode element 240 becomes even or uniform along the laser cavity compared with the conventional one. Alternatively, a plurality of phase shift portions may be formed in the grating. In this case, evenness or uniformity of the distribution will be further improved.

Figure 11:
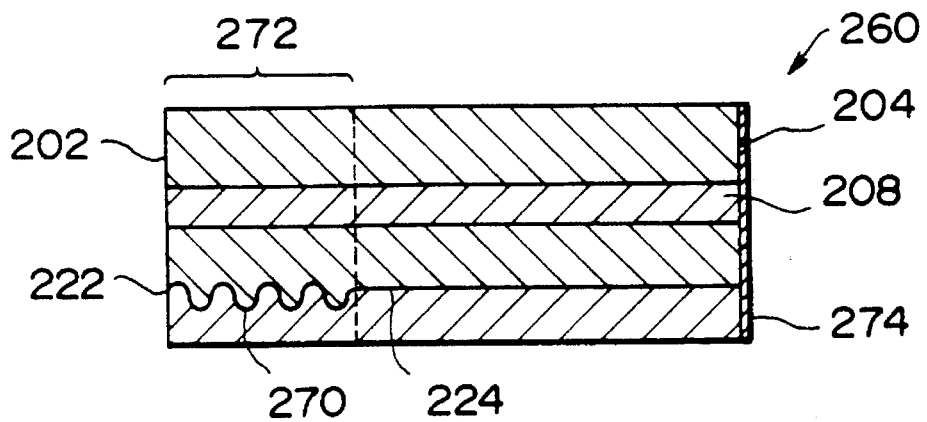
FIG. 11 schematically shows in vertical section a side view of a laser diode element according to the fifth embodiment of the present invention.

Referring to FIG. 11, a laser diode element 260 according to the fifth embodiment of this invention has a structure similar to that of the laser diode element 200 illustrated in FIG. 6 except for the followings.

In this embodiment, the partial grating 270 is kept in contact with the front facet 202 to provide a contact side 222 and a non-contact side 224 with the partial grating 210 interposed therebetween and extended from the contact side 222 towards the non-contact side 224. The portion in which the partial grating 270 is formed is operable as distributed Bragg reflector region 272.

A plurality of coating layers 274 are coated on the rear facet 204 which is opposite to the distributed Bragg reflector region 272 to provide a high reflectivity. Light output is generated from the front facet 202 which is adjacent to the distributed Bragg reflector region 272.

Figure 12:
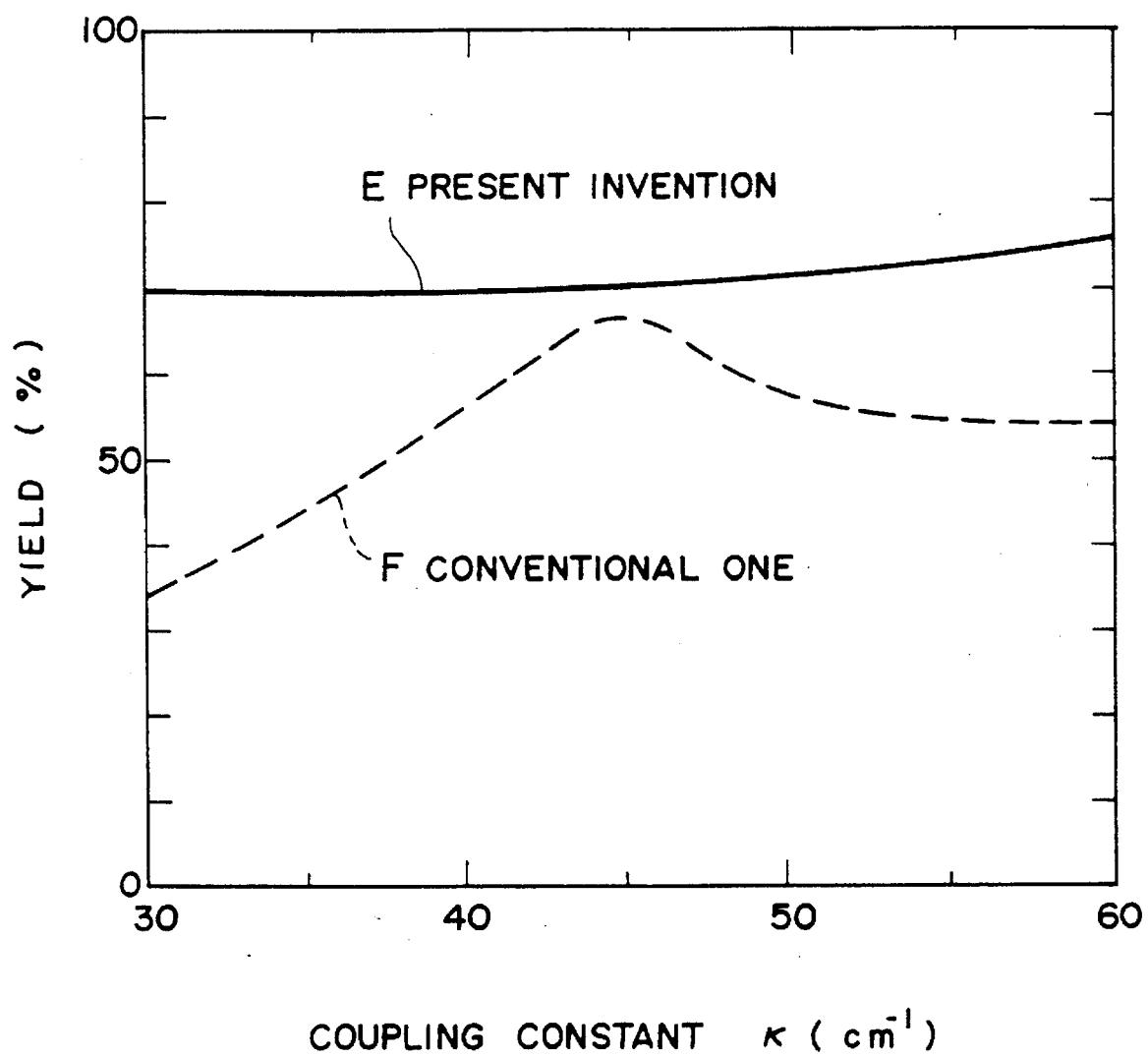
FIG. 12 shows a graphical representation for use in describing a relationship between yield and coupling constant K in the laser diode element illustrated in FIG. 11 in comparison with the conventional one.

Referring to Fig 12, description is made about a relationship between a yield and coupling constant in the laser diode element 260 illustrated in FIG. 11 in comparison with the conventional one. In FIG. 12, the yield is defined as a rate of numbers of the laser diode elements in which a value of the $IMD_3$ is smaller than −80 dBc.

In FIG. 12, a continuous line E shows the yield of the laser diode elements 260 while a broken line F shows that of the conventional laser diode element.

As indicated in FIG. 12, the yield of the laser diode elements 260 is stable even though the coupling constant K is changed. In other words, the yield of the laser diode elements 260 does not depend on the coupling constant K. Consequently, it becomes unnecessary to control the coupling constant K strictly.

Figure 13:
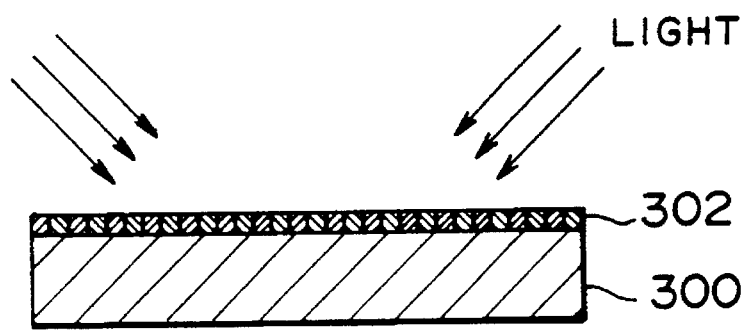
Figs 13(a) through (e) show in schematic vertical sections a laser diode element during progress of a method of manufacturing the laser diode element according to the second embodiment of the present invention.
Figure 13:
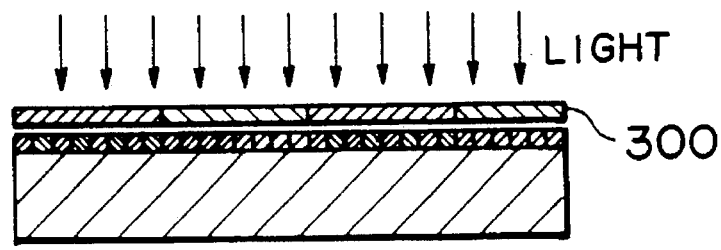
Figure 13:
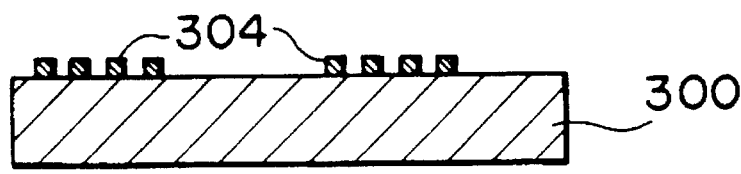
Figure 13:
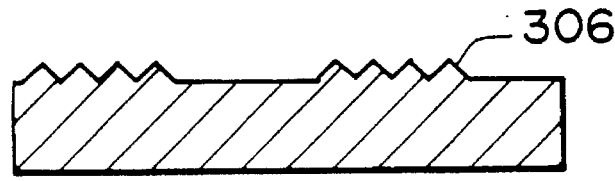
Figure 13:
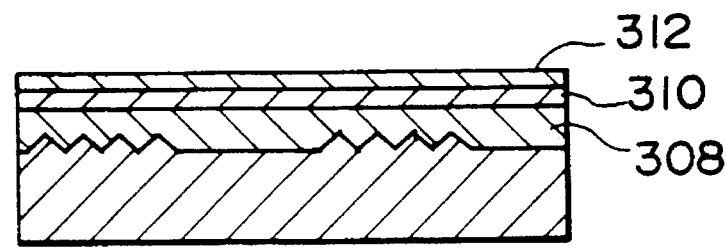
Figure 14:
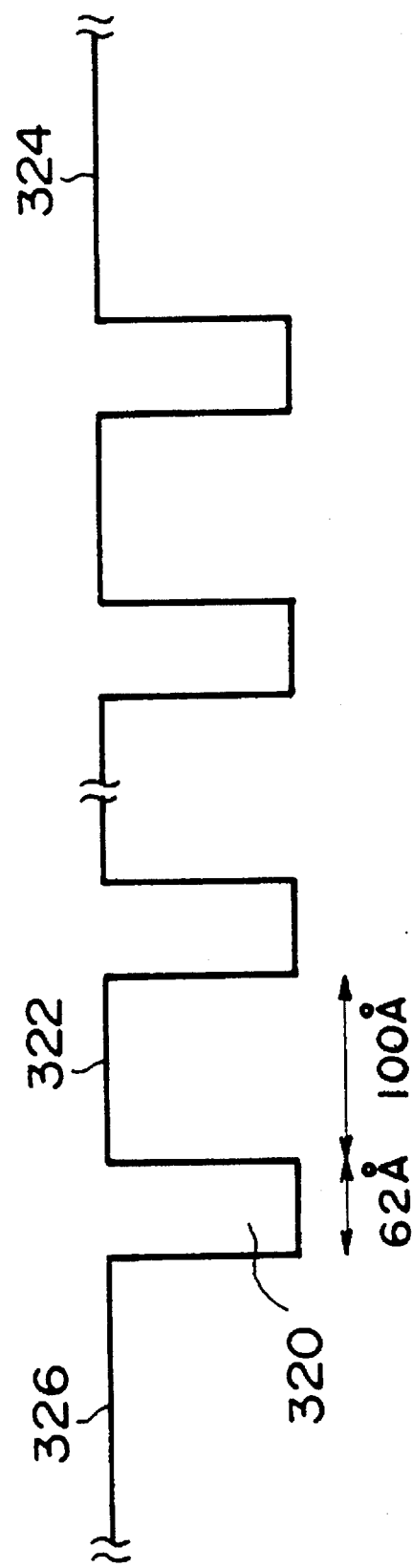
FIG. 14 shows a band diagram of active layers of a laser diode element according to the second embodiment of the present invention.
Figure 15:
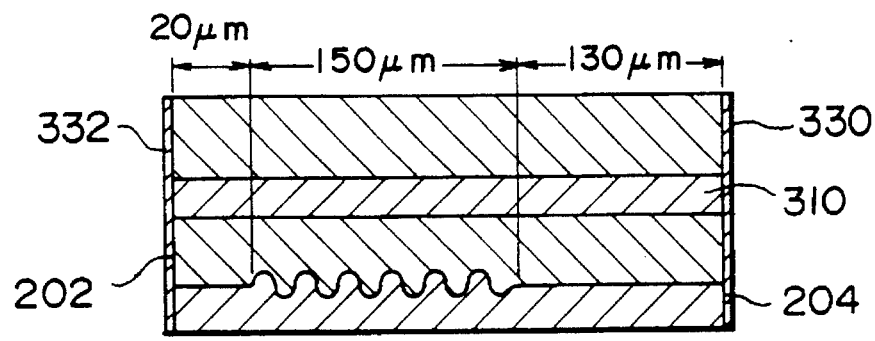
FIG. 15 schematically shows in vertical section a side view of a laser diode element according to the second embodiment of the present invention.

Referring now to FIGS. 13 through 15, description will proceed to a method of manufacturing the above-mentioned laser diode element according to the second embodiment of the present invention.

As shown in FIG. 13(a), a substrate 300 of n-InP is at first prepared in a known manner. A photoresist 302 is then coated on the substrate 300. The photoresist 302 is exposed by holographic lithography method to be patterned with a period of 2025 angstroms.

Second, as illustrated in FIG. 13(b), the substrate 300 and the patterned photoresist 302 are closely exposed by the use of a mask 303 having a predetermined mask pattern. In this event, an area in which a grating should not be formed is selectively permitted to be exposed. After being developed, a predetermined pattern 304 is formed on the substrate 300 for partially making the grating, as illustrated in FIG. 13(c). The substrate 300 is etched to form a partial grating 306 having a depth of 400 angstroms by using the predetermined pattern 304 as an etching mask. In this case, a coupling constant in the partial grating 306 is 40 cm$^{-1}$.

Third, a light guiding layer 308 of n-InGaAsP is grown on the partial grating 306 and the substrate 300 by the aforesaid MOVPE method to have a thickness of 1000 angstroms. An active layer 310 of MQW structure is then stacked on the light guiding layer 308 by the same method to have a thickness of about 0.5 micron meters. Thereafter, a clad layer 312 of p-InP is formed on the active layer 310 by the same method to have a thickness of approximately 0.5 micron meters.

Referring to FIG. 14, the active layer 310 of MQW structure includes wells 320 and barriers 322. The wells 320 have a composition defined by a bandgap corresponding to a wavelength of 1.40 micron meters. On the other hand, the barriers 322 have a composition defined by a bandgap corresponding to a wavelength of 1.13 micron meters. Specifically, the wells 320 are equal in number to ten. Each well is provided by a film having a thickness of 62 angstroms while each barrier is also provided by a film having a thickness of 100 angstroms. The wells 320 and the barriers 322 are interposed on both sides between SCH layers 324 and 326 each of which has a composition defined by a bandgap corresponding to a wavelength of 1.13 micron meters. Although it is not shown in FIG. 14, the SCH layer 324 is adjacent to a p-InP layer and has a thickness of 600 angstroms while the SCH layer 326 is adjacent to a n-InP layer and has a thickness of 300 angstroms.

After growth of these layers, a positive photoresist (not shown) is coated on the layers. Photolithography and etching are then carried out in a known manner to form stripe-shaped grooves (not shown).

Thereafter, p-InP electric current blocking layer, n-InP electric current blocking layer, p-InP clad layer, and p-InGaAsP cap layer are formed one by one in a known manner to form a double-channel planar buried hetero (DC-PBH) structure.

Further, electrode layers are evaporated on both surfaces of the DC-PBH structure. The DC-PBH structure is cleaved at a predetermined portion.

AS illustrated in FIG. 15, coating layers 330 are coated on the rear facet 204 to provide a reflectivity of 75% while the additional cladding layers 332 are coated on the front facet 202 to provide a low reflectivity. The coating layers 330 are composed of SiN Thereafter, the cleaved DC-PBH wafer is scribed or cut along the width direction into a plurality of the laser diode elements.

Under the circumstances, characteristics of each of the laser diode elements have been investigated and estimated. Consequently, it has been found out that the laser diode element oscillates with a wavelength of 1.31 micron meters.

In order to estimate intermodulation distortion characteristics of the laser diode element, the laser diode element is assembled into a module so that IMD$_3$ of the laser diode element be measured. As a result, a value of the above-mentioned IMD was −85 dBc on conditions that an average light output power is 5 mW and optical modulation index is 20%.

In order to investigate a merit of this invention, a conventional laser diode element has been fabricated as a comparative example. In this example, a value of the IMD$_3$ was −78 dBc on the same conditions.

Thus, it has been confirmed that the laser diode element according to the embodiment of the present invention has excellent intermodulation distortion characteristics.

In this event, a yield, which is defined to be a rate of numbers of the laser diode elements in which a value of the above-mentioned IMD$_3$ is smaller than −80 dBc, was 18% in the laser diode element according to the embodiment of the present invention while the yield was about 12% in the conventional laser diode elements.

Figure 16A:
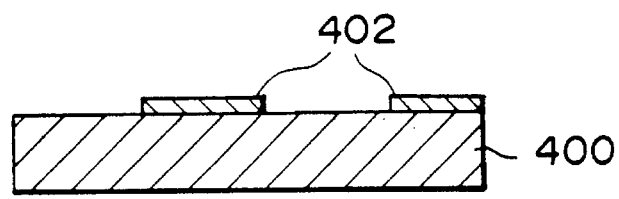
FIGS. 16(a) through (d) show in schematic vertical sections a laser diode element during progress of a method of manufacturing the laser diode element according to the third embodiment of the present invention.
Figure 16B:
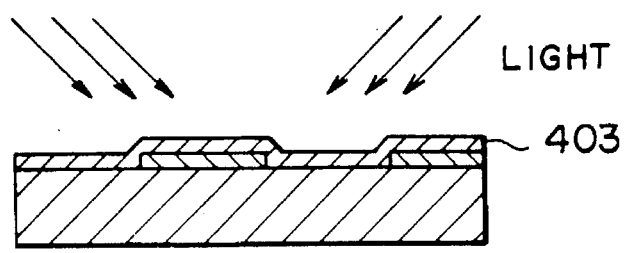
Figure 16C:
Figure 16D:
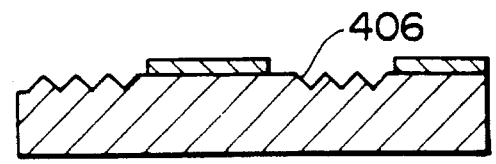
Figure 17:
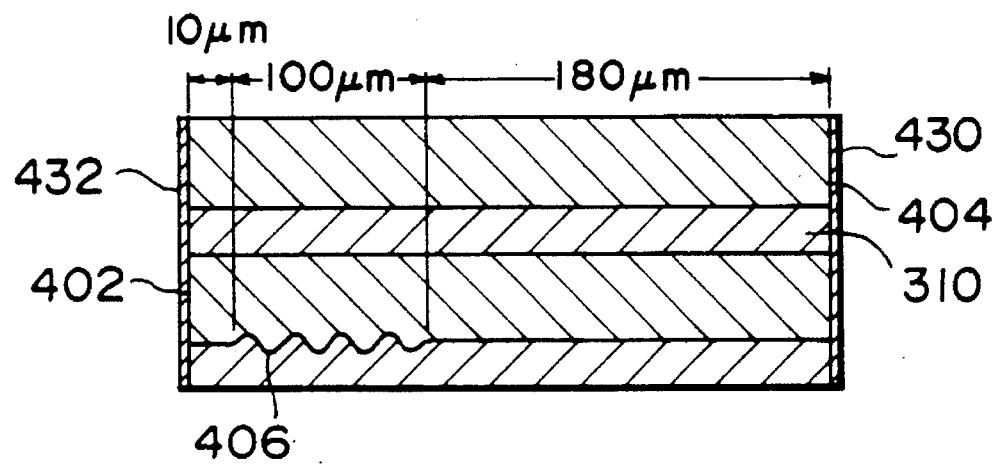
FIG. 17 schematically shows in vertical section a side view of a laser diode element according to the third embodiment of the present invention.
Figure 18:
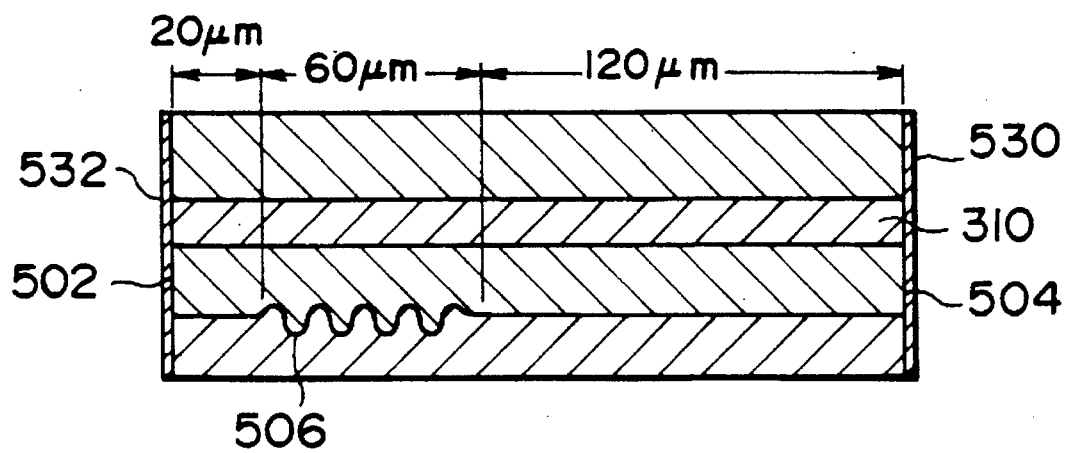
FIG. 18 schematically shows in vertical section a side view of a laser diode element according to the third embodiment of the present invention.

Referring now to FIGS. 16 through 18, description will proceed to a method of manufacturing the above-mentioned laser diode element according to the third embodiment of the present invention. The method according to the third embodiment has steps similar to those of the above-mentioned second embodiment except for the following points.

In this embodiment, after a semiconductor substrate 400 is prepared in a known manner, insulating layers 402 of SiO$_2$ are formed on the semiconductor substrate 400, as shown in FIG. 16(a). A depth of the partial grating 406 is made so that a coupling constant in the partial grating 406 may be 30 cm$^{-1}$. After the partial grating 406 is formed, the insulating layers 402 of SiO$_2$ as well as the photoresist 403 are removed from the semiconductor substrate 400. Further, as illustrated in FIG. 17, coating layers 430 are coated on the rear facet 404 to provide a reflectivity of 90% while the additional coating layers 432 are coated on the front facet 402 to provide a reflectivity of 1%.

In this event, the above-described yield was 20%. Besides, insulating layers 402 of SiO$_2$ may alternatively be replaced with insulating layers of Si$_3$N$_4$.

Another laser diode elements according to a modification of the third embodiment have also been fabricated.

As illustrated in FIG. 18, the laser diode element has a partial grating 506 having a length of 60 micron meters. On the other hand, a length of the laser cavity is 20 micron meters. Further, as illustrated in FIG. 18, coating layers 530 are coated on the rear facet 504 to provide a reflectivity of 98% while the additional coating layers 532 are coated on the front facet 502 to provide a reflectivity of 0.1%.

In this event, the above-described yield was about 22%.

Figure 19:
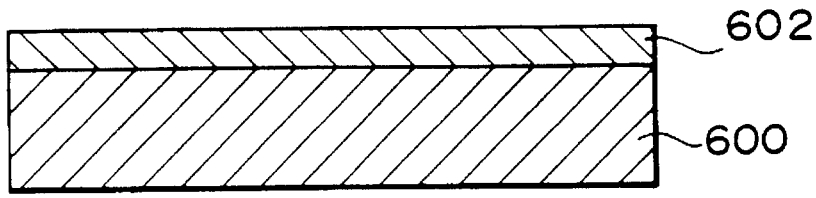
FIGS. 19(a) through (d) show in schematic vertical sections a laser diode element during progress of a method of manufacturing the laser diode element according to the fourth embodiment of the present invention.
Figure 19:
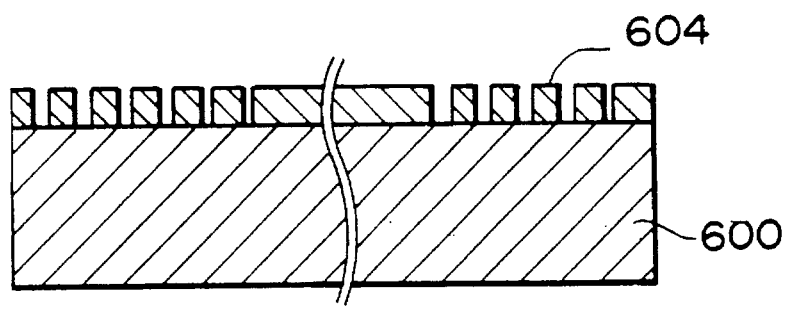
Figure 19:
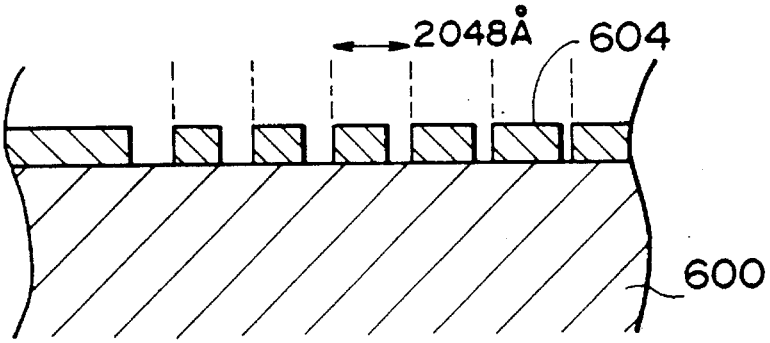
Figure 19:
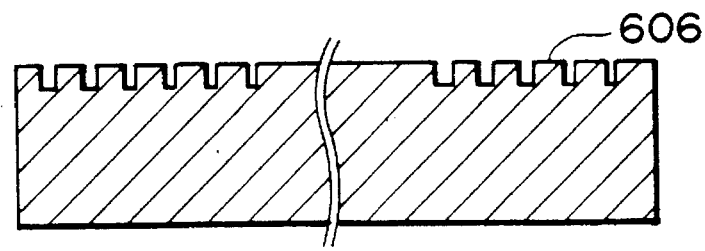
Figure 20:
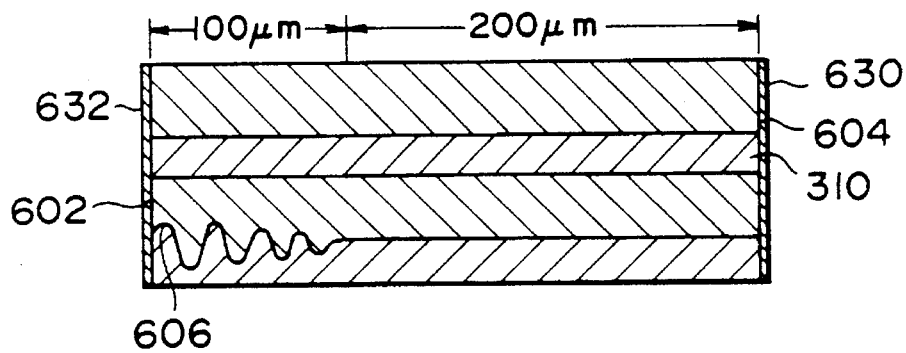
FIG. 20 schematically shows in vertical section a side view of a laser diode element according to the fourth embodiment of the present invention.

Referring now to FIGS. 19 and 20, description will proceed to a method of manufacturing the above-mentioned laser diode element according to the fourth embodiment of the present invention. The method according to the fourth embodiment has steps similar to those of the above-mentioned second embodiment except for the following points.

In this embodiment, after an InP substrate 600 is prepared in a known manner, a resist layer 602 for electron beam exposure is coated on the InP substrate 600, as shown in FIG. 19(a). By the electron beam exposure or lithography, a predetermined pattern 604 is formed on the substrate 600 for partially making the grating, as illustrated in FIG. 19(b). The predetermined pattern 604 is enlarged to be shown in FIG. 19(c) merely for the better understanding thereof. The pattern 604 has a period of 2048 angstroms A ratio of exposed area versus non-exposed area in each one period is changed gradually from 1:1 to 1:10. The substrate 600 is etched to form a partial grating 606, as illustrated in FIG. 19(d), by using the predetermined pattern 604 as an etching mask.

Further, as illustrated in FIG. 20, coating layers 630 are coated on the rear facet 604 to provide a reflectivity of 75% while the additional coating layers 632 are coated on the front facet 602 to provide a reflectivity of 1%. As illustrated in FIG. 20, the partial grating 606 is kept in contact with the front facet 602 and extends from the front facet 602 to have a length of 100 micron meters. The coupling constant K is larger in the contact side than in the non-contact side. Namely, the coupling constant K is 70 cm$^{-1}$ in the contact side while 30 cm$^{-1}$ in the non-contact side.

A value of the above-mentioned $IMD_3$ of the laser diode element has also been measured As a result, the value of the $IMD_3$ was −85 dBc.

Figure 21:
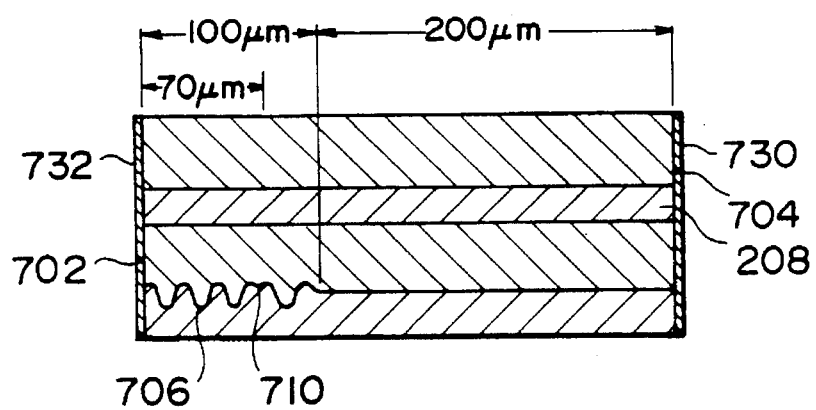
FIG. 21 schematically shows in vertical section a side view of 8 laser diode element according to the fifth embodiment of the present invention.

Referring to FIG. 21, description will proceed to a laser diode element according to the fifth embodiment of the present invention. The fifth embodiment has a structure similar to that of the above-mentioned second embodiment except for the following points.

In this embodiment, as illustrated in FIG. 21, the partial grating 706 extends from the front facet 702 to have a length of 100 micron meters, like the laser diode element illustrated in FIG. 20, but has the coupling constant K of 50 cm$^{-1}$ uniformly from the contact side to the non-contact side. The partial grating 706 has, however, an irregular portion 710 which is operable as a $\lambda/4$ phase shift portion. The irregular portion 710 is positioned where the partial grating 706 extends from the front facet 702 by 70 micron meters.

A value of the above-mentioned $IMD_3$ of this laser diode element has also been measured. As a result, the value of the $IMD_3$ was −82 dBc.

Further, an intensity ratio of a main mode oscillation and a sub-mode oscillation is also measured. The intensity ratio was 35 dBc in the embodiment, although 38 dBc in the conventional laser diode element.

Furthermore, the similar effects have been achieved in another fabricated laser diode elements, in case that the grating includes a phase shift portion falling within a range between $\lambda/8$ and $\lambda/2$.

Thus, characteristics of single mode oscillation is improved in the laser diode element according to this embodiment.

Figure 22:
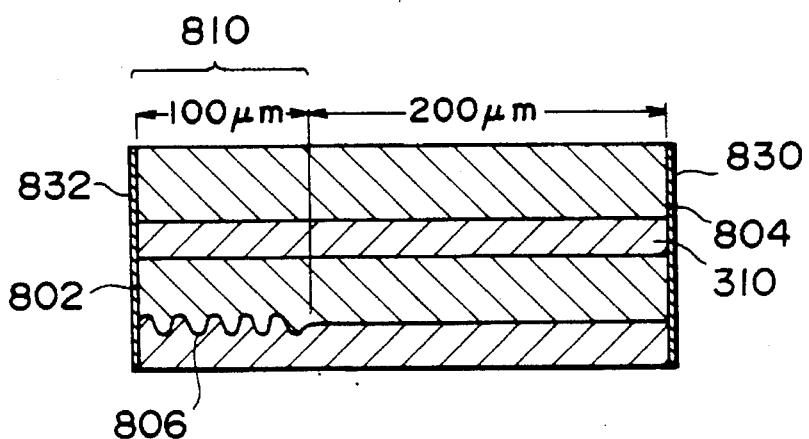
FIG. 22 schematically shows in vertical section a side view of a laser diode element according to the sixth embodiment of the present invention.

Referring to FIG. 22, description will proceed to a laser diode element according to the sixth embodiment of the present invention.

In this embodiment, as illustrated in FIG. 22, the laser diode element has the partial grating 806 extends from the front facet 802 to have a length of 100 micron meters to make a distributed Bragg reflector region 810.

Further, as illustrated in FIG. 22, coating layers 830 are coated on the rear facet 804 to provide a reflectivity of 75% while the additional coating layers 832 are coated on the front facet 802 to provide a reflectivity of 1%. The partial grating 806 has the coupling constant K of 50 cm$^{-1}$ uniformly from the contact side to the non-contact aide.

A value of the above-mentioned $IMD_3$ of the laser diode element has also been measured. As a result, the value of the $IMD_3$ was −83 dBc. In addition, the above-described yield was about 25%.

Moreover, the similar effects have been achieved in another fabricated laser diode elements, in case that a reflectivity of coating layers coated on the rear facet falls within a range between 40% and 98%.

While this invention has thus far been described in conjunction with several embodiments thereof, it will now be readily possible for one skilled in the art to put this invention into effect in various other manners. For example, the active layer is not restricted to have the above-mentioned MQW structure. The active layer may also have a bulk structure.

What is claimed is:

1. A laser diode element comprising:
    a semiconductor block having:
        a first end surface;
        a second end surface opposite to said first end surface;
        a laser cavity which is formed between said first and said second end surfaces and which has a predetermined length L; and
        an active layer and a partial grating which are formed in the direction of said laser cavity and which are coupled to each other at a predetermined coupling constant K;
        said partial grating being nearer to one of said first and said second end surfaces than to the other of said first and said second end surfaces and being remote from said one of said first and said second end surfaces to divide the direction of the laser cavity into a short length side and a long length side with said partial grating interposed between said short and said long length sides, said predetermined coupling constant K being larger in said short length side than in said long length side.

2. A laser diode element as claimed in claim 1, wherein said coupling constant K decreases as a distance in the direction becomes remote from said short length side.

3. A laser diode element comprising:
    a semiconductor block having:
        a first end surface;
        a second end surface opposite to said first end surface;
        a laser cavity which is formed between said first and said second end surfaces and which has a predetermined length L; and
        an active layer and a partial grating which are formed in the direction of said laser cavity and which are coupled to each other at a predetermined coupling constant K; and
        said partial grating being kept in contact with one of said first and said second end surfaces to provide a contact side and a non-contact side with said partial grating interposed therebetween and extended from the contact said towards the non-contact side, said predetermined coupling constant K being larger in said contact side than in said non-contact side.

4. A laser diode element as claimed in claim 3, wherein said coupling constant K decreases as a distance in the direction becomes remote from said contact side.

* * * * *